(12) United States Patent
Gieskes et al.

(10) Patent No.: US 10,893,638 B2
(45) Date of Patent: Jan. 12, 2021

(54) DISPENSING HEAD HAVING A NOZZLE HEATER DEVICE, SYSTEM AND METHOD

(71) Applicant: Universal Instruments Corporation, Conklin, NY (US)

(72) Inventors: Koenraad Alexander Gieskes, Deposit, NY (US); Philip Michael Castoro, Endicott, NY (US); Kevin James O'Reilly, Binghamton, NY (US)

(73) Assignee: UNIVERSAL INSTRUMENTS CORPORATION, Conklin, NY (US)

( * ) Notice: Subject to any disclaimer, the term of this patent is extended or adjusted under 35 U.S.C. 154(b) by 117 days.

(21) Appl. No.: 16/095,965

(22) PCT Filed: May 18, 2017

(86) PCT No.: PCT/US2017/033227
§ 371 (c)(1),
(2) Date: Oct. 24, 2018

(87) PCT Pub. No.: WO2017/205167
PCT Pub. Date: Nov. 30, 2017

(65) Prior Publication Data
US 2019/0141868 A1    May 9, 2019

Related U.S. Application Data

(60) Provisional application No. 62/342,714, filed on May 27, 2016.

(51) Int. Cl.
*H05K 13/04* (2006.01)
*H05B 1/00* (2006.01)
(Continued)

(52) U.S. Cl.
CPC ........... *H05K 13/0408* (2013.01); *H05B 1/00* (2013.01); *H05K 13/0411* (2018.08);
(Continued)

(58) Field of Classification Search
CPC ....... B05D 5/00; B05C 5/0001; B05C 5/0225; H05K 13/04; H05K 13/0404; H05K 13/0408

See application file for complete search history.

(56) References Cited

U.S. PATENT DOCUMENTS 3,810,728 A * 5/1974 Jacobs .................... B29C 45/07
425/547
4,189,137 A   2/1980 Denney et al.
(Continued)

FOREIGN PATENT DOCUMENTS

CN    101836525 A    9/2010
CN    202006331 U    10/2011
(Continued)

OTHER PUBLICATIONS

Application No. PCT/US2017/033227, International Search Report and the Written Opinion of the International Searching Authority, or the Declaration dated Aug. 14, 2017, 13 pages.
(Continued)

*Primary Examiner* — Gregory A Wilson
(74) *Attorney, Agent, or Firm* — Schmeiser, Olsen & Watts, LLP

(57) ABSTRACT

Disclosed is a dispensing head that includes a first spindle configured for movement in a vertical direction, a first nozzle operatively attached to the spindle, a heater device removably attachable to the dispensing head. The heater device includes a heat source and an opening configured to receive the first nozzle. The heat source is configured to heat the first nozzle above an ambient temperature. An assembly system is further disclosed, along with a method of heating a nozzle.

18 Claims, 11 Drawing Sheets

(51) Int. Cl.
*H05K 3/34* (2006.01)
*H05K 3/12* (2006.01)

(52) U.S. Cl.
CPC ... *H05K 13/0469* (2013.01); *H05B 2203/007* (2013.01); *H05K 3/1241* (2013.01); *H05K 3/1283* (2013.01); *H05K 3/3485* (2020.08); *H05K 3/3494* (2013.01)

(56) References Cited

U.S. PATENT DOCUMENTS

| | | | |
|---|---|---|---|
| 4,611,397 A | 9/1986 | Janisiewwicz et al. | |
| 4,759,124 A | 7/1988 | Snyder et al. | |
| 4,763,941 A | 8/1988 | Sniderman | |
| 4,799,854 A | 1/1989 | Niskala | |
| 4,872,258 A | 10/1989 | Ragard | |
| 5,029,383 A | 7/1991 | Snyder et al. | |
| 5,195,235 A | 3/1993 | Mifuji | |
| 5,252,807 A | 10/1993 | Chizinsky | |
| RE35,027 E | 8/1995 | Ragard | |
| 5,572,785 A | 11/1996 | Tveit | |
| 5,581,909 A | 12/1996 | Ueda et al. | |
| 5,747,102 A * | 5/1998 | Smith | B05C 5/001 427/98.4 |
| 5,909,837 A | 6/1999 | Safabakhsh et al. | |
| 5,971,250 A | 10/1999 | Safabakhsh et al. | |
| 6,244,640 B1 | 6/2001 | Le Bricquer et al. | |
| 6,625,878 B2 | 9/2003 | Gieskes | |
| 6,772,813 B2 | 8/2004 | Becher et al. | |
| 6,837,293 B1 | 1/2005 | Mok et al. | |
| 6,851,733 B2 | 2/2005 | Mori et al. | |
| 7,354,085 B2 | 4/2008 | Mori et al. | |
| 7,374,217 B2 | 5/2008 | Pabst | |
| 7,814,654 B2 | 10/2010 | Mizuno et al. | |
| 9,291,302 B2 * | 3/2016 | Iwaki | H05K 13/0404 |
| 9,480,996 B2 * | 11/2016 | Reiland | B05B 7/1606 |
| 10,500,604 B2 * | 12/2019 | Levins | B05C 5/001 |
| 2008/0017627 A1 | 1/2008 | Iwata et al. | |
| 2009/0031558 A1 | 2/2009 | Mizuno et al. | |
| 2010/0170884 A1 | 7/2010 | Iwata et al. | |
| 2010/0269330 A1 * | 10/2010 | Higuchi | H01L 24/75 29/729 |
| 2012/0117796 A1 | 5/2012 | Kim | |
| 2018/0270999 A1 * | 9/2018 | Tsuri | H05K 13/04 |

FOREIGN PATENT DOCUMENTS

| | | |
|---|---|---|
| CN | 203912354 U | 10/2014 |
| JP | H05102383 A | 4/1993 |
| JP | H05218689 A | 8/1993 |
| WO | 2004/088017 A1 | 10/2004 |
| WO | 2005/101943 A2 | 10/2005 |
| WO | 2017/205167 A1 | 11/2017 |

OTHER PUBLICATIONS

Office Action in related Chinese Patent Application No. 201780027027.1, dated Mar. 19, 2020. 2 pages.

* cited by examiner

DISPENSING HEAD HAVING A NOZZLE HEATER DEVICE, SYSTEM AND METHOD

RELATED MATTERS

This application claims priority to PCT Application No. PCT/US17/33227, having a filing date of May 18, 2017, which claims priority to provisional patent application No. 62/342,714 filed May 27, 2016, and entitled "Heated Nozzle System," the disclosures of which are hereby incorporated by reference.

TECHNICAL FIELD

This invention relates generally to heating a component during a pick and place cycle. More particularly, the present invention relates to heating a nozzle on a dispensing head such that the heat from the nozzle may be transferred to a component being held by the nozzle, along with a system and method for heating a nozzle.

RELATED ART

Frequently, there is a need to use a heated nozzle in specific electronic assembly placement processes. Often, the need occurs when the part to be placed is thin, or thermally instable, such that the part would curl up or move when heated in an oven (e.g. to cure adhesive or melt solder between the part and the substrate).

Traditionally, pick and place systems having heated nozzles that achieve temperatures significantly above ambient temperatures include a built-in heating element supported with wires. Nozzles are typically attached to spindles which provide both vertical (Z) and rotational (θ) motion. Therefore, managing wires for heating elements restricts vertical motion and eliminates the possibility of full 360° rotation.

In state of the art pick and place systems with heated nozzles, electrical power is brought to the nozzle tip by a cable that provides for limited up/down and rotational motion of the nozzle. Alternatively, power may be brought to the nozzle tip by a cable in combination with a slip-ring unit to allow limited up/down and free rotation of the nozzle. In these nozzles, electrical power is turned to controlled heat by use of a resistive heating element located in good conductive connection to the nozzle tip.

Flexible cables and slip-ring contacts are expensive and cumbersome to package, especially in multi spindle configurations. The connection of the cable to the nozzle has disadvantages. A first disadvantage is that the cable, however flexible, puts varying forces on the nozzle depending on the angle of the nozzle and the length of the Z-stroke. At the required accuracy levels for most electronic assembly, these forces lead to non-optimal placement. Another disadvantage of the cable connection is that the machine controller needs to stay within the limitations of Z and θ, which may influence calibration and optimization for maximum speed.

Thus, an improved dispensing head having a heated nozzle, system and method of use thereof would be well received in the art.

BRIEF DESCRIPTION OF THE DISCLOSURE

According to one aspect, a dispensing head comprises: a first spindle configured for movement in a vertical direction; a first nozzle operatively attached to the spindle; and a heater device removably attachable to the dispensing head, the heater device including: a heat source; and an opening configured to receive the first nozzle, wherein the heat source is configured to heat the first nozzle above an ambient temperature.

According to another aspect, an assembly system comprises: a dispensing head including: a spindle configured for movement in a vertical direction; a nozzle operatively attached to the spindle; and a heater device mountable to the dispensing head, the heater device including: a heat source; and an opening configured to receive the spindle, wherein the heat source is configured to heat the spindle by at least one of convection, conduction, and radiance; and a positioning system configured to move the dispensing head; wherein the dispensing head is configured to at least partially assemble an unfinished product.

According to another aspect, a method of heating a nozzle comprises: providing a dispensing head including: a first spindle configured for movement in a vertical direction; a first nozzle operatively attached to the spindle; attaching a heater device to the dispensing head, the heater device including: a heat source; an opening; and receiving the first spindle and the first nozzle by the opening; and heating the first spindle and the first nozzle with the heat source above an ambient temperature.

BRIEF DESCRIPTION OF THE DRAWINGS

Some embodiments of this invention will be described in detail, with reference to the following figures, wherein like designations denote like members, wherein.

DETAILED DESCRIPTION OF THE INVENTION

A detailed description of the hereinafter described embodiments of the disclosed apparatus and method are presented herein by way of exemplification and not limitation with reference to the Figures.

Figure 1:
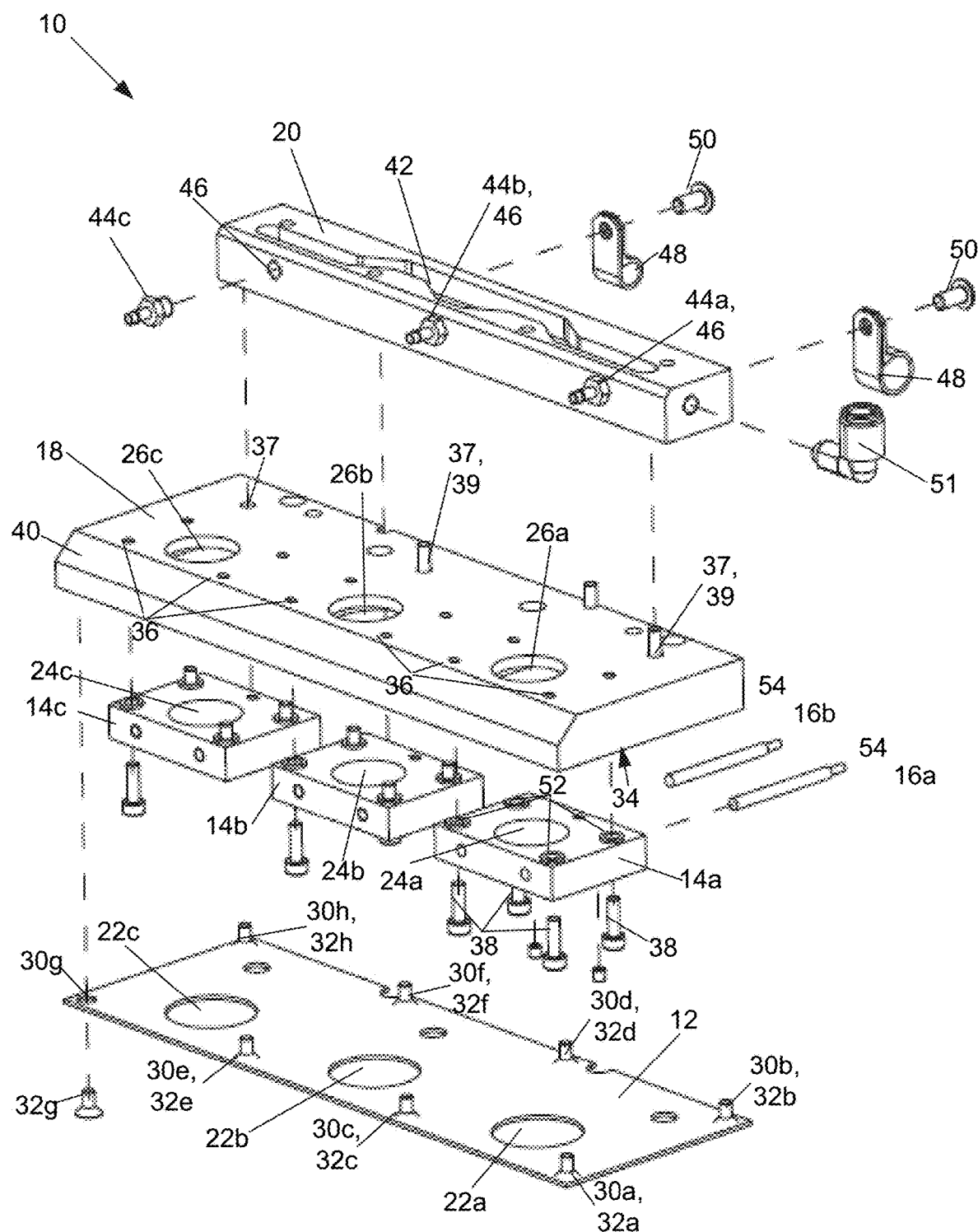
FIG. 1 depicts an exploded view of a heater device according to one embodiment.
Figure 2:
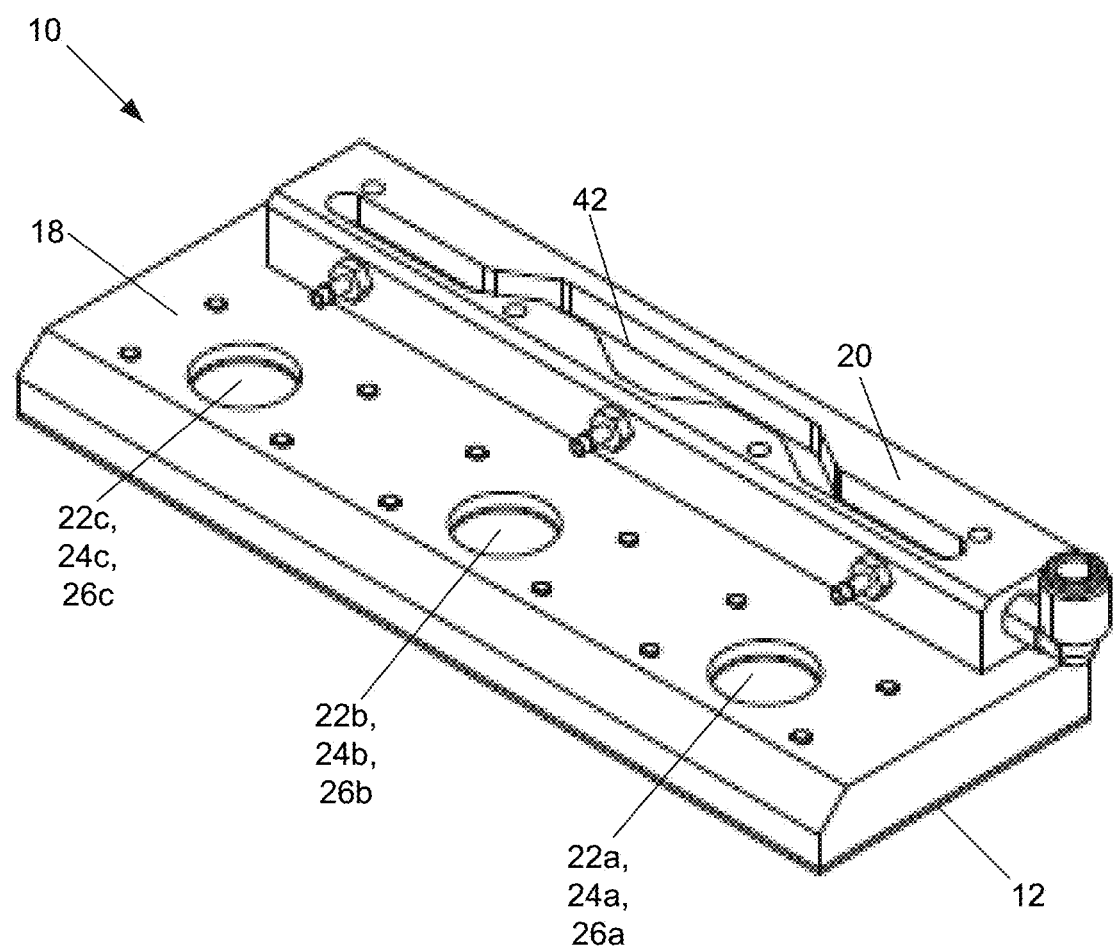
FIG. 2 depicts a perspective view of the heater device of FIG. 1 according to one embodiment.
Figure 3:
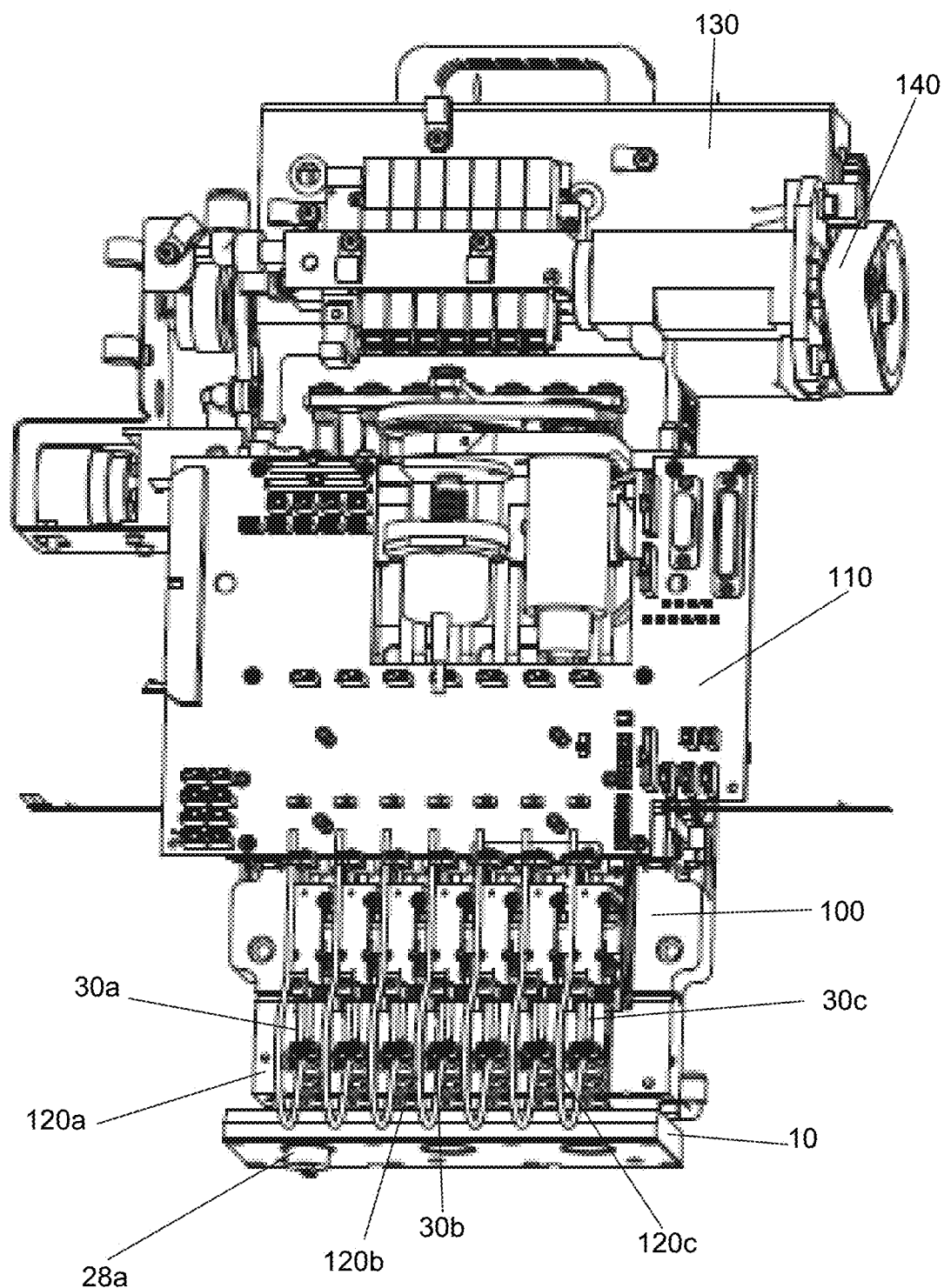
FIG. 3 depicts a perspective view of the heater device of FIGS. 1-2 mounted to a dispensing head according to one embodiment.
Figure 4:
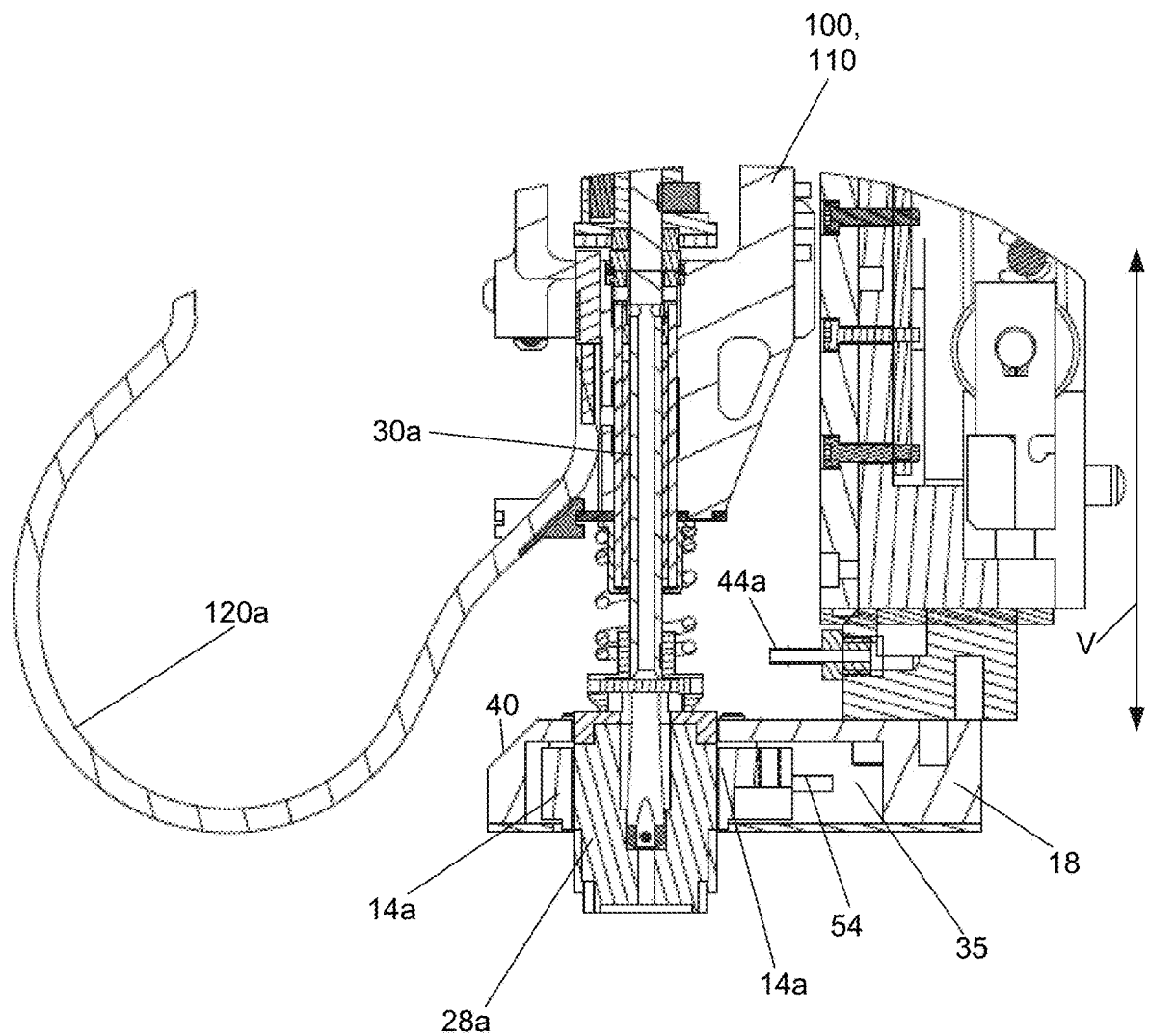
FIG. 4 depicts a cross sectional view of the heater device of FIGS. 1-2 mounted to the dispensing head of FIG. 3 in accordance with one embodiment.

Referring to FIGS. 1-4, a heater device 10 is shown. FIGS. 3 and 4 show the heater device 10 attached to a dispensing head 100. The dispensing head 100 may be attached to an assembly machine 130 that includes a positioning system 140 that may be configured to move the dispensing head 100. For example, the positioning system 140 may be a robot arm, a gantry robot, or the like. The assembly machine 130 may be a surface mount machine, a pick and place machine, an automation machine, packaging machine for semiconductor devices or chips, or the like.

The heater device 10 includes a bottom cover 12, a heater blocks 14*a*, 14*b*, 14*c*, heating elements 16*a*, 16*b*, 16*c*, 16*d*, 16*e*, 16*f*, a case 18, as well as a mount portion 20. Openings 22*a*, 22*b*, 22*c* are shown in the bottom cover 12. Similarly, openings 24*a*, 24*b*, 24*c* are shown in each of the heater blocks 14*a*, 14*b*, 14*c*, respectively. Further, openings 26*a*, 26*b*, 26*c* are shown in the case 18. In the embodiment shown, the openings 22*a*, 24*a*, 26*a* are configured to receive a first nozzle 28*a* and/or a first spindle 30*a*. Likewise, the openings 22*b*, 24*b*, 26*b* are configured to receive a second nozzle 28*b* and/or a second spindle 30*b*. The openings 22*c*, 24*c*, 26*c* are configured to receive a third nozzle 28*c* and/or a third spindle 30*c*. As shown, the nozzles 28*a*, 28*b*, 28*c* may be operatively attached to the spindles 30*a*, 30*b*, 30*c*, respectively. Further, the spindles 30*a*, 30*b*, 30*c* may be configured for movement in a vertical direction V relative to a main body 110 of the dispensing head 100.

The heater device 10 may be removably attachable to the dispensing head 100. When the heater device 10 is attached to the dispensing head 100 and the nozzles 28*a*, 28*b*, 28*c* and/or spindles 30*a*, 30*b*, 30*c* are received by the openings 22*a*, 22*b*, 22*c*, the heating elements 16*a*, 16*b*, 16*c*, 16*d*, 16*e*, 16*f* and the heater blocks 14*a*, 14*b*, 14*c* are configured to apply heat to each of the respective first nozzle 28*a*, the second nozzle 28*b*, and the third nozzle 28*c*. This may raise the temperature of the first nozzle 28*a*, the second nozzle 28*b*, and the third nozzle 28*c* above an ambient temperature. The embodiment shown is configured for three spindles and nozzle combinations. However, more or less than three sets of components may be provided as necessary by widening or narrowing the width of the heater device 10.

The bottom cover 12 of the heater device 10 may be made from an insulative material. In one embodiment, Garolite may be used, for example, Garolite G7. Other insulative materials are contemplated, such as Peek, or Celazole. The bottom cover 12 is shown including a plurality of screw openings 30*a*, 30*b*, 30*c*, 30*d*, 30*e*, 30*f*, 30*g*, 30*h* to accommodate corresponding screws 32*a*, 32*b*, 32*c*, 32*d*, 32*e*, 32*f*, 32*g*, 32*h*. The screws 32*a*, 32*b*, 32*c*, 32*d*, 32*e*, 32*f*, 32*g*, 32*h* may be configured to attach the bottom cover 12 to the case 18. Additional openings (not shown) are also contemplated to facilitate attachment of the heater blocks 14*a*, 14*b*, 14*c* to the bottom cover 12 if additional structural support is determined to be necessary. The openings 22*a*, 22*b*, 22*c* shown in the bottom cover 12 may be cut or bored out of the bottom cover 12 during fashioning or fabrication of the bottom cover 12. The openings 22*a*, 22*b*, 22*c* are shown as circles in the embodiment shown, having dimensions that correspond with the dimensions of the nozzles 28*a*, 28*b*, 28*c* and the spindles 30*a*, 30*b*, 30*c*. Thus, the openings 22*a*, 22*b*, 22*c* may be slightly larger but close in size to the nozzles 28*a*, 28*b*, 28*c* and the spindles 30*a*, 30*b*, 30*c* to reduce airflow from within the heater device 10 to the outside, thereby saving energy. Differently dimensioned openings are contemplated in other embodiments if differently dimensioned nozzles and/or spindles are provided. The openings 22*a*, 22*b*, 22*c* may even be dimensioned with different shapes, such as ovular, elliptical, square or the like.

The case 18 of the heater device 10 may also be made from an insulative material, such as Garolite G7. The case 18 may be made from the same materials described hereinabove with respect to the bottom cover 12. In some embodiments, it may be advantageous for the case 18 to be made of a different material than the cover 12. For example, Peek, or Celazole are contemplated. The case 18 may include an internal hollow chamber 35 configured to house the heater blocks 14*a*, 14*b*, 14*c*. The openings 26*a*, 26*b*, 26*c* of the case 18 may be similarly dimensioned to the openings 22*a*, 22*b*, 22*c* of the bottom cover 12. The openings 26*a*, 26*b*, 26*c* of the case 18 may have the exact same dimensions as the openings 22*a*, 22*b*, 22*c* of the bottom cover 12. The case 18 may be configured to retain the heat from the heater blocks 14*a*, 14*b*, 14*c* to conserve thermal energy and maintain high temperatures efficiently within the hollow chamber 35.

A bottom surface 34 of the case 18 may include openings (not shown) to receive the screws 32*a*, 32*b*, 32*c*, 32*d*, 32*e*, 32*f*, 32*g*, 32*h* to attach the bottom cover 12 to the case 18. Openings 36 may further be configured to receive screws 38. The openings 36 may be threaded to receive an end of the screws 38 for attaching the heater blocks 14*a*, 14*b*, 14*c* to the case 18. The case 18 may further include openings 37 for screws 39 for attaching the mount portion 20 to the case 18.

The case 18 may further include a chamfered edge 40. When the heater device 10 is attached to the dispensing head 100, the chamfered edge 40 may be proximate lines 120*a*, 120*b*, 120*c* which are configured to provide compressed air and vacuum to the moving spindles 30*a*, 30*b*, 30*c*. The chamfered edge 40 may be configured to provide clearance so that the lines 120*a*, 120*b*, 120*c* do not contact the heater device 10 and the case 18 when slack is increased in the lines 120*a*, 120*b*, 120*c* as a result of the dispensing head 100 moving.

The mount portion 20 may be attached to the case 18. The mount portion 20 may be configured to allow or facilitate the heater device 10 to be attachable to and removable from the dispensing head 100. The heater device 10 may be an adapter for adapting the dispensing head 100 to provide heat to nozzles. The mount portion 20 may include a channel 42 configured to receive a mount portion of the dispensing head 100. The channel 42 may be keyed dimensionally to receive the mount portion of the dispensing head 100. Fittings 44*a*, 44*b*, 44*c* may be insertable into openings 46 of the mount portion 20 to secure the mount portion 20 to the dispensing head 100. The mount portion 20 may further include clamps 48 and screws 50 for facilitating attachment or attaching the mount portion 20 to the dispensing head 100. The mount portion 20 may further include a fitting 51 for further facilitating attachment or attaching the mount portion 20 to the dispensing head 100. While the mount portion 20 is shown as one embodiment for attaching the heater device 10 to the dispensing head 100, other means or mechanisms for mounting are contemplated. Further, the mount portion 20 may have whatever appropriate dimension to accommodate the type of dispensing head desired to be equipped with the heater device 10. In one embodiment, the mount portion 20 may not be necessary because it is contemplated that the heater device 10 may not be an attachable and removable component, but rather an integral component to a heat providing dispensing head.

The heater blocks 14*a*, 14*b*, 14*c* are shown with openings 52 through which the screws 38 extend. The heater blocks 14*a*, 14*b*, 14*c* may be made from a material with high heat conductive properties that acts as a heat sink. For example, the heater blocks 14*a*, 14*b*, 14*c* may each be made of aluminum or aluminum alloys. In other embodiments, the heater blocks 14*a*, 14*b*, 14*c* may be made of copper, a composite material, or the like. The heater blocks 14*a*, 14*b*, 14*c* may include the openings 24*a*, 24*b*, 24*c* which may be similarly dimensioned to the openings 22a, 22b, 22c and the openings 26a, 26b, 26c, described hereinabove. The heater blocks 14a, 14b, 14c may each include two channels or openings which are configured to receive the respective heating elements 16a, 16b, 16c, 16d, 16e, 16f. The heating elements 16a, 16b, 16c, 16d, 16e, 16f may each be elongated metallic elements. The heating elements 16a, 16b, 16c, 16d, 16e, 16f may be cartridges that are insertable into the channels or openings of the heater blocks 14a, 14b, 14c. The heating elements 16a, 16b, 16c, 16d, 16e, 16f may each include a protruding end 54 that extend from the heater blocks 14a, 14b, 14c once inserted into the channels or openings. The heating elements 16a, 16b, 16c, 16d, 16e, 16f may be configured to heat the heater blocks 14a, 14b, 14c. The heating elements 16a, 16b, 16c, 16d, 16e, 16f may be attachable to an energy source such as a wire or cable for providing electrical energy. The wires or cables may be insertable into an opening of the case 18. In one embodiment, the back of the case 18 (not shown) may be open to allow for insertion of wires or cables to provide energy to the heating elements 16a, 16b, 16c, 16d, 16e, 16f. The wires or cables may transfer electricity to the heating elements 16a, 16b, 16c, 16d, 16e, 16f from a source located in the dispensing head 10 itself. In other embodiments, the wires or cables may transfer electricity to the heating elements 16a, 16b, 16c, 16d, 16e, 16f from a source located in the assembly machine 130. In one embodiment, the heating elements 16a, 16b, 16c, 16d, 16e, 16f may be resistance heating elements made of a high resistance material such as Nichrome.

Other embodiments are contemplated which include a single elongated heater block that includes multiple openings. Still further, more or less heating elements per nozzle opening are contemplated. The heater blocks 14a, 14b, 14c may provide heat to the nozzles 28a, 28b, 28c through radiation, convection, or conduction. Thus, the heater blocks 14a, 14b, 14c may be configured to contact the nozzles 28a, 28b, 28c, respectively. In other embodiments, space may be located between the heater blocks 14a, 14b, 14c and the nozzles 28a, 28b, 28c. The heater blocks 14a, 14b, 14c may be configured to provide a uniform temperature profile over or across each of the nozzles 28a, 28b, 28c. This uniform temperature profile may be provided by the heater blocks 14a, 14b, 14c, or whatever form of heat sink is provided in the heating device 10. The heating device 10 may provide this uniform temperature with embodiments having any number of spindles, openings, nozzles, heater blocks and heating elements. Further, the heater blocks 14a, 14b, 14c may have enough heat capacity to quickly reheat the nozzles 28a, 28b, 28c after they have been used to pick, place, and/or otherwise dispense an electronic component. This capacity may be provided by the mass, size, thickness, material properties, and the like of the heater blocks 14a, bl4b, 14c. This heat capacity may be ensured in all embodiments of the heating device 10 having any number of spindles, openings, nozzles, heater blocks and heating elements.

The spindles 30a, 30b, 30c may be adapted for full 360° rotation while the heating elements 16a, 16b, 16c, 16d, 16e, 16f and/or the heater blocks 14a, 14b, 14c heat the nozzles 28a, 28b, 28c. In another embodiment, the dispensing head 10 itself may be adapted for full 360° rotation while the heating elements 16a, 16b, 16c, 16d, 16e, 16f and/or the heater blocks 14a, 14b, 14c heat the nozzles 28a, 28b, 28c. In the embodiment shown, no nozzles or spindles are attached to cables or wires to accomplish the heating. Thus, full 360° rotation of the spindles 30a, 30b, 30c can occur without twisting any wires. Similarly, if the wires or cables attaching to the heating elements 16a, 16b, 16c, 16d, 16e, 16f come from the dispensing head 100, the dispensing head itself can rotate fully 360° without twisting wires as well. Furthermore, the heater device 10 may be configured to remain stationary and not move relative to the main body 110 of the dispensing head when the spindles 30a, 30b, 30c are moving during picking and placing and/or dispensing processes.

FIG. 3 shows the heater device 10 mounted onto the dispensing head 100. While the dispensing head 100 may include seven spindles, the heater device 10 only includes three of the openings for receiving spindles. Thus, when the heater device 10 is attached to the seven spindle dispensing head 100, four of the spindles may be disabled, while the active spindles 30a, 30b, 30c may remain enabled and operational.

Figure 10:
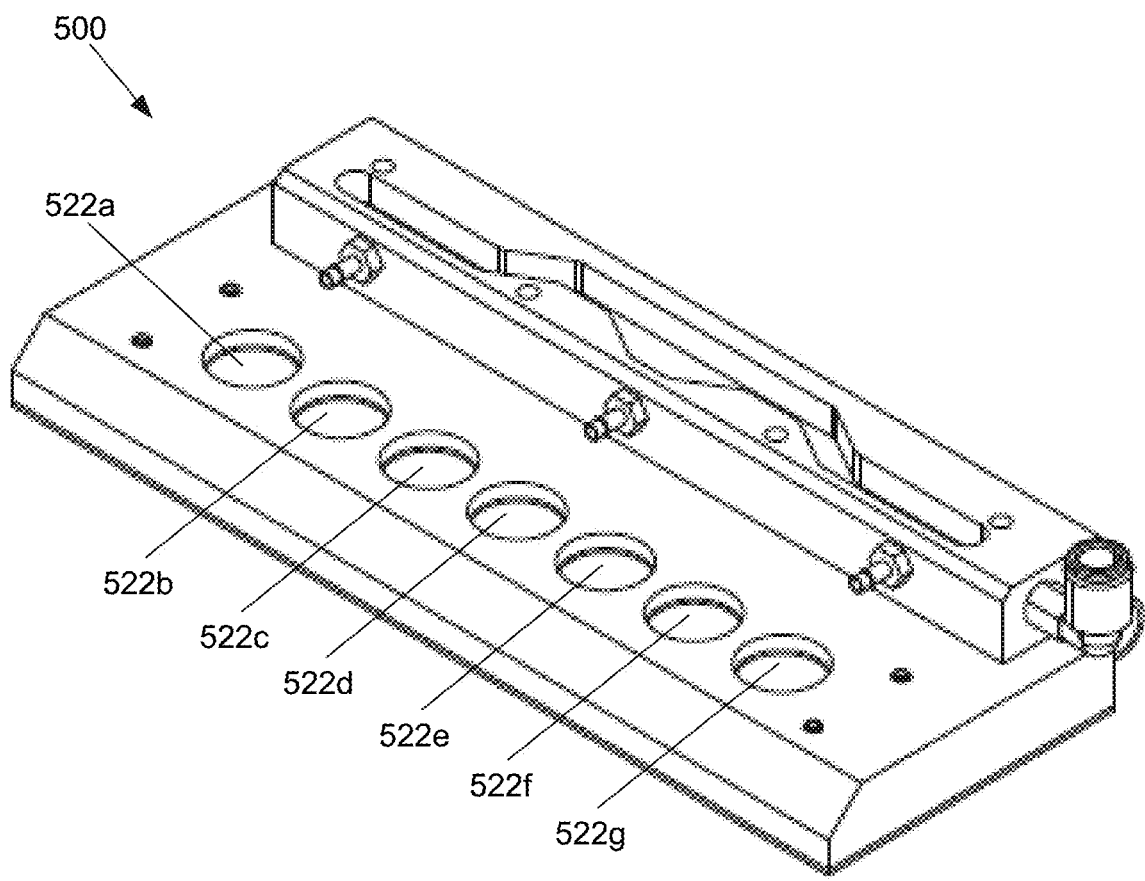
FIG. 10 depicts a perspective view of an alternate heater device according to one embodiment.
Figure 11:
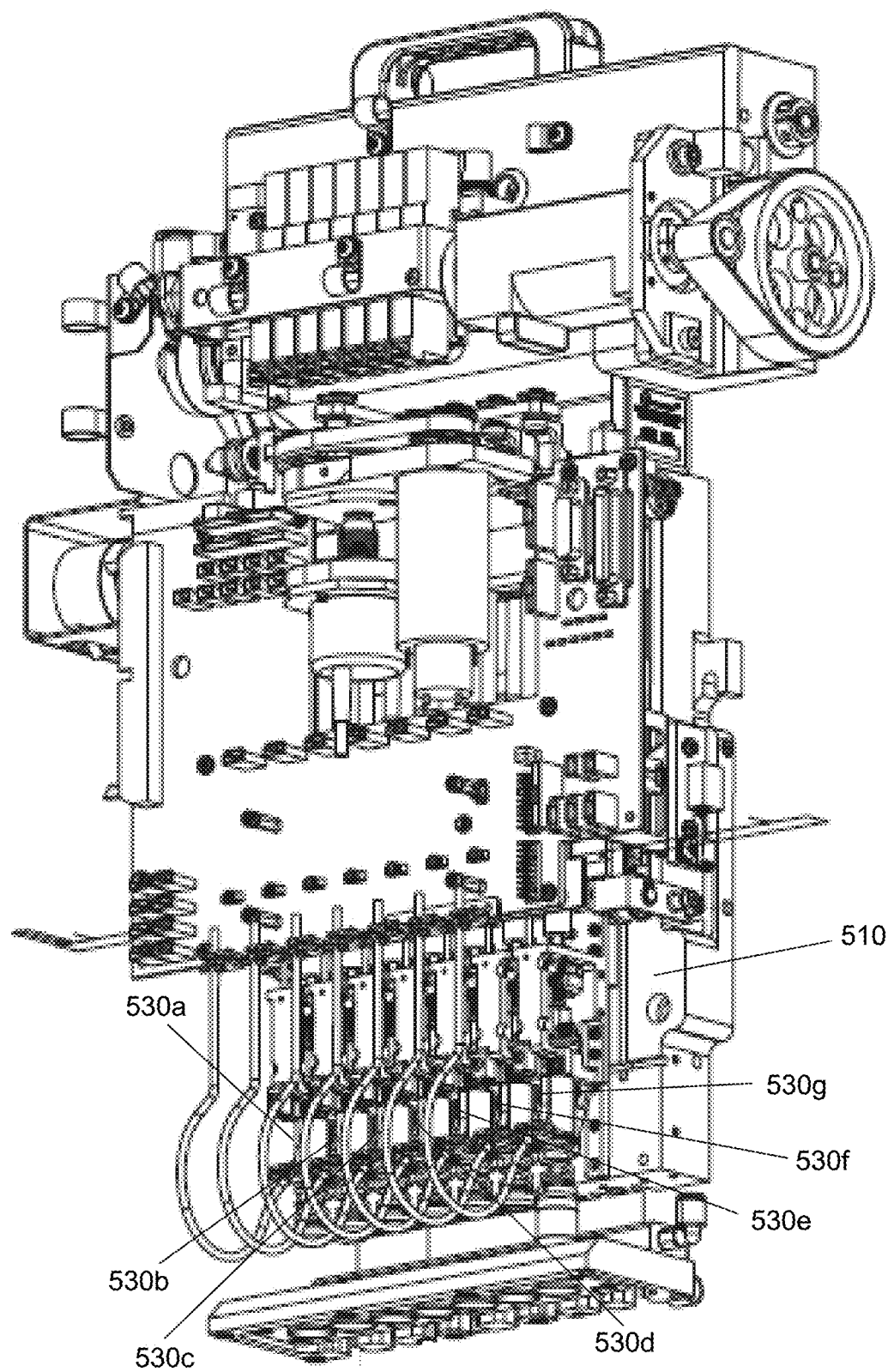
FIG. 11 depicts a perspective view of the heater device of FIG. 10 mounted to a dispensing head according to one embodiment.

Another embodiment of a heater device 500 is shown in FIGS. 10-11. The heater device 500 includes seven openings 522a, 522b, 522c, 522d, 522e, 522f, 522g. While the internal components such as the heat source (heater blocks and/or heating elements) are not shown, additional heat sources are contemplated, similar to the heater device 10, which provide a uniform heat profile to the seven openings 522a, 522b, 522c, 522d, 522e, 522f, 522g. The heater device 500 is attachable to the seven spindle dispensing head 510 so that each seven spindles 530a, 530b, 530c, 530d, 530e, 530f, 530g remain enabled and operational. Thus, the heater device 500 may be configured to heat all seven nozzles during pick and place and/or dispensing projects that require full functionality of each nozzle.

Figure 5:
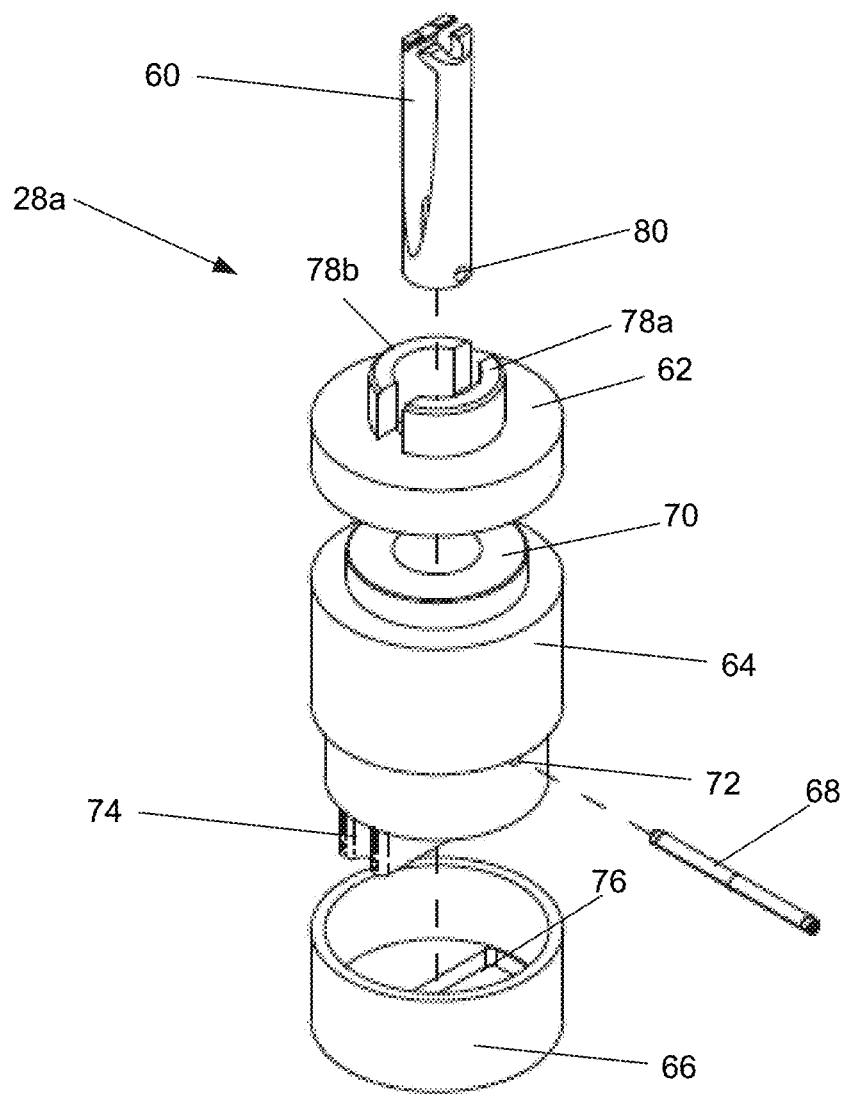
FIG. 5 depicts an exploded view of a heated nozzle in accordance with one embodiment.
Figure 6:
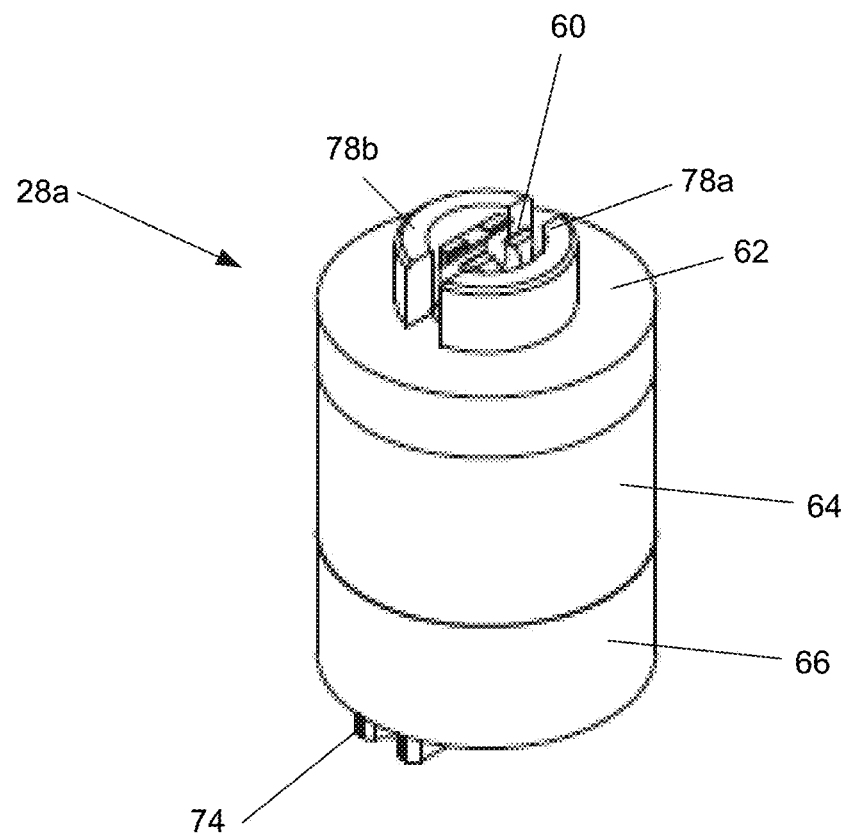
FIG. 6 depicts a perspective view of the heated nozzle of FIG. 5 in accordance with one embodiment.

Referring to FIGS. 5 and 6, the nozzle 28a is shown. The nozzle 28a is shown including a latch pin 60, a top cap 62, a nozzle body 64, and a bottom cap 66. A spring pin 68 is shown for holding the bottom cap 66 together with the nozzle body 64. The spring pin 68 is insertable into an opening 72 of the nozzle body 64 and an opening 80 of the latch pin 60, thereby holding the nozzle 28a together. The spring pin 68 may be biased outwardly and received into a corresponding cavity, aperture, or hole (not shown) in the bottom cap 66. Other assembly methods are contemplated.

The nozzle body 64 includes a top circumferential lip or protrusion 70 and a nozzle tip 74. The top circumferential lip 70 may be configured to integrate with a bottom portion of the top cap 62 to connect the nozzle body 64 to the top cap 62. The bottom cap 66 includes an opening 76 through which the nozzle tip 74 extends when the nozzle 28a is in a constructed state (shown in FIG. 6). The top cap 62 further includes guide lips 78a, 78b which retain the latch pin therein. The guide lips 78a, 78b are semi circumferential with two gaps on opposing sides.

The top cap 62 may be made of an insulative material. For example, the top cap may be made from an Ultem™ resin. Likewise, the bottom cap 66 may also be made from an insulative material such as Ultem™ resin. Other insulative materials are contemplated for the top cap 62 and the bottom cap 66 such as Peek, or Celazole. The nozzle body 64, including the nozzle tip 74, may be made of a thermally conductive material, such as aluminum. Other thermally conductive materials are contemplated, such as copper.

The nozzle 28a may be the same as the other nozzles 28b, 28c. Further, the nozzles 28a, 28b, 28c may be removable nozzles that are applicable to the dispensing head 100 and the spindles 30a, 30b, 30c when heat is needed during placement. Thus, a user may remove standard nozzles from a dispensing head and replace them with the thermally advantageous nozzles 28a, 28b, 28c. The nozzles 28a, 28b, 28c that interface with the heater device 10 may be made of the same material as the heater blocks 14a, 14b, 14c and may be in good heat conductive contact with the heater blocks 14a, 14b, 14c, in one embodiment. The respective mass of the nozzles 28a, 28b, 28c, along with the heater blocks 14a, 14b, 14c may be dimensioned such that the draw of energy through the nozzle tip 74 and an electronic component (not shown) during the placement dwell cycle on the substrate may lead to an acceptable temperature drop at the nozzle tip 74. While not placing electronic components, the nozzles 28a, 28b, 28c may be pulled to the heat sink of the heating source (i.e. the heater blocks 14a, 14b, 14c and/or the heating elements 16a, 16b, 16c, 16d, 16e, 16f, 16g, 16h) and may be brought to the required temperature before the pick-up of the next electronic component.

Figure 7:
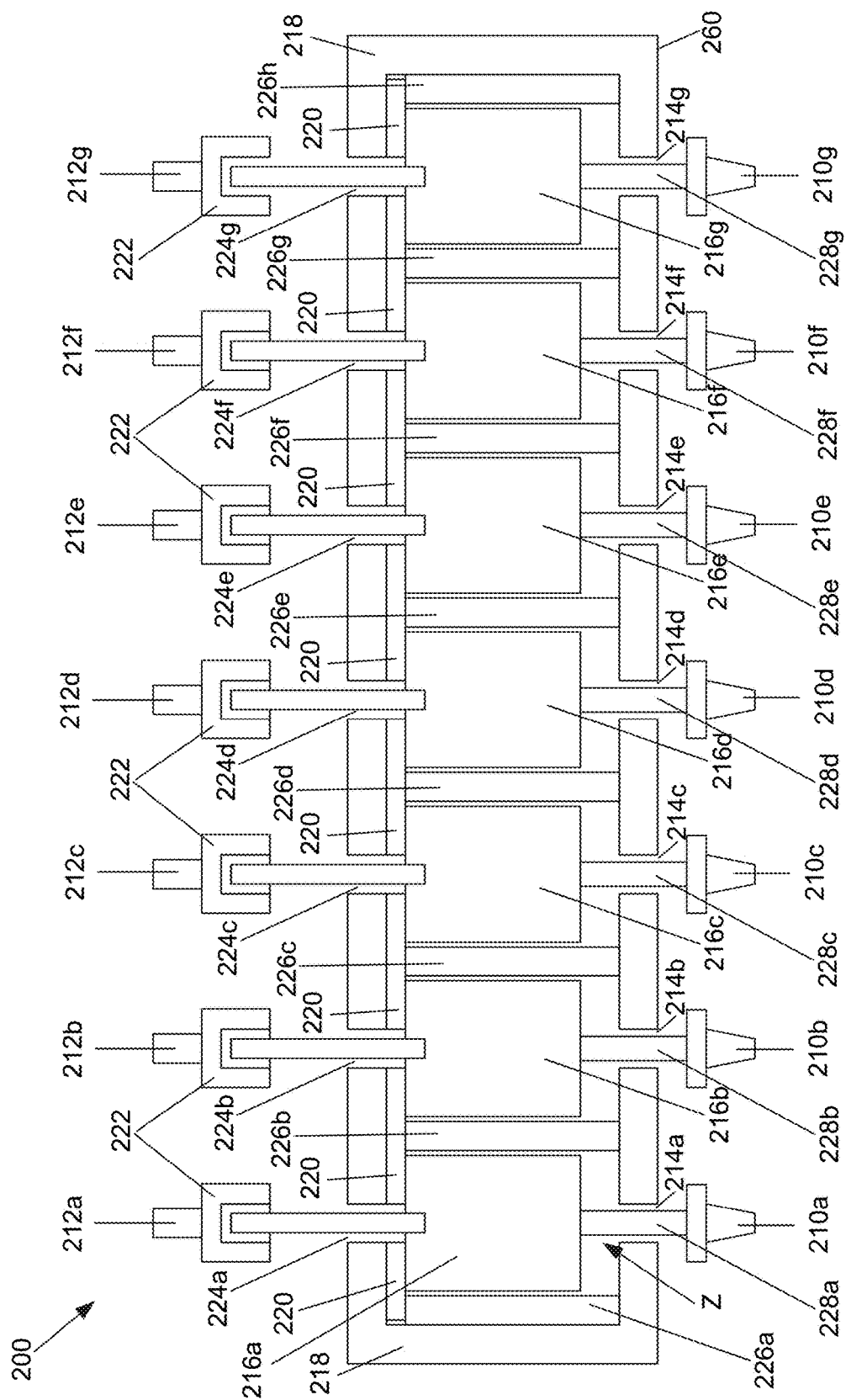
FIG. 7 depicts a side cutaway view of a seven-spindle dispensing head in accordance with one embodiment.

Referring now to FIG. 7, another embodiment of a seven spindle dispensing head 200 is shown. The dispensing head 200 includes a first nozzle 210a, a second nozzle 210b, a third nozzle 210c, a fourth nozzle 210d, a fifth nozzle 210e, a sixth nozzle 210f, and a seventh nozzle 210g. Similarly, the dispensing head 200 includes a first spindle 212a for moving the first nozzle 210a, a second spindle 212b for moving the second nozzle 210b, a third spindle 212c for moving the third nozzle 210c, a fourth spindle 212d for moving the fourth nozzle 210d, a fifth spindle 212e for moving the fifth nozzle 210e, a sixth spindle 212f for moving the sixth nozzle 210f, and a seventh spindle 212g for moving the seventh nozzle 210g. The spindles 212a, 212b, 212c, 212d, 212e, 212f, 212g may be configured to move respective nozzles 210a, 210b, 210c, 210d, 210e, 210f, 210g in a Z-stroke defined by the amount the movement capable in the vertical direction as well as around the z-axis in a rotary motion.

The nozzles 210a, 210b, 210c, 210d, 210e, 210f, 210g may be made of a thermally conductive material such as zirconium or copper. The nozzles 210a, 210b, 210c, 210d, 210e, 210f, 210g may be attached or connected to respective main bodies 216a, 216b, 216c, 216d, 216e, 216f, 216g. These main bodies 216a, 216b, 216c, 216d, 216e, 216f, 216g may also be thermally conductive bodies made of, for example, copper.

The dispensing head 200 includes an outer housing 218 surrounding the spindles 212a, 212b, 212c, 212d, 212e, 212f, 212g and/or the nozzles 210a, 210b, 210c, 210d, 210e, 210f, 210g. The outer housing 218 may be made of an insulative material. In other embodiments, an insulation layer may be inside or outside of the outer housing 218 to retain the heat within the outer housing 218. The dispensing head 200 may further include a heat sink plate 220 located at a top surface within the outer housing 218. The outer housing 218 and the heat sink plate 220 may include openings 224a, 224b, 224c, 224d, 224e, 224f, 224g located at the top of the outer housing 218 to receive and/or accommodate the spindles 212a, 212b, 212c, 212d, 212e, 212f, 212g. The spindles 212a, 212b, 212c, 212d, 212e, 212f, 212g may each include an attached insulative portion 222 that are configured to cover the openings 224a, 224b, 224c, 224d, 224e, 224f, 224g when the spindles 212a, 212b, 212c, 212d, 212e, 212f, 212g are in the downwardly extended position. Openings 214a, 214b, 214c, 214d, 214e, 214f, 214g may be located in a bottom of the outer housing 218 in order to receive and or accommodate the nozzles 210a, 210b, 210c, 210d, 210e, 210f, 210g. Lower spindle portions 228a, 228b, 228c, 228d, 228e, 228f, 228g may extend from within the outer housing 218 through the openings 214a, 214b, 214c, 214d, 214e, 214f, 214g, respectively. The lower spindle portions 228a, 228b, 228c, 228d, 228e, 228f, 228g may conduct heat from within the outer housing 218 to the nozzles 210a, 210b, 210c, 210d, 210e, 210f, 210g, respectively.

The outer housing 218, including the main bodies 216a, 216b, 216c, 216d, 216e, 216f, 216g and the nozzles 210a, 210b, 210c, 210d, 210e, 210f, 210g may be a removable and attachable adapter that may be attached or connected to the spindles 212a, 212b, 212c, 212d, 212e, 212f, 212g of the dispensing head 200 after other nozzles (not shown) have been removed therefrom. The outer housing 218 may be configured to heat an internal chamber 260 within the outer housing 218 through the heat sink plate 220. An energy source (not shown) such as a cable, wire or the like may be connected to the heat sink plate 220 to energize and heat the heat sink plate 220. The heat sink plate 220 may have enough heat capacity to quickly reheat the nozzles 210a, 210b, 210c, 210d, 210e, 210f, 210g after it has been used to heat an electronic component (not shown) during picking, placement and/or dispensing. The heat sink plate 220 may be in contact with a plurality of heated bodies 226a, 226b, 226c, 226d, 226e, 226f, 226g, 226h that run parallel and divide each of the main bodies 216a, 216b, 216c, 216d, 216e, 216f, 216g. The bodies 226a, 226b, 226c, 226d, 226e, 226f, 226g, 226h may be separate components that surround the respective the cylindrical main bodies 216a, 216b, 216c, 216d, 216e, 216f, 216g. Alternatively, the bodies 226a, 226b, 226c, 226d, 226e, 226f, 226g, 226h may actually be a single structural component having a plurality of cylindrical openings each configured to receive one of the cylindrical main bodies 216a, 216b, 216c, 216d, 216e, 216f, 216g. Whatever the embodiment, the heat sink plate 220 may be located above the bodies 226a, 226b, 226c, 226d, 226e, 226f, 226g, 226h and may provide heat to the bodies 226a, 226b, 226c, 226d, 226e, 226f, 226g, 226h which in turn heat the cylindrical main bodies 216a, 216b, 216c, 216d, 216e, 216f, 216g and the nozzles 210a, 210b, 210c, 210d, 210e, 210f, 210g. A space may be located between the cylindrical main bodies 210a, 210b, 210c, 210d, 210e, 210f, 210g and the heated bodies 226a, 226b, 226c, 226d, 226e, 226f, 226g, 226h to allow for relative movement between the two components. In this embodiment, there may be no contact between the heat sink plate 220 and the spindles 212a, 212b, 212c, 212d, 212e, 212f, 212g and/or the nozzles 210a, 210b, 210c, 210d, 210e, 210f, 210g. Instead, the outer housing 218 may act as an oven in order to continuously keep the rotating and/or up and down moving spindles 212a, 212b, 212c, 212d, 212e, 212f, 212g and/or nozzles 210a, 210b, 210c, 210d, 210e, 210f, 210g at the required temperature. This oven configuration may also maintain a uniform temperature profile over the plurality of nozzles 210a, 210b, 210c, 210d, 210e, 210f, 210g. This configuration may provide heat from the heat sink plate 220 by convection and radiation without contact between the heat sink plate 220 and the nozzles 210a, 210b, 210c, 210d, 210e, 210f, 210g.

Similar to the embodiment shown above, there may be no movement of the outer housing 218 and the heat sink plate 220 relative to the main body of the dispensing head 200 when the spindles 212a, 212b, 212c, 212d, 212e, 212f, 212g move relative to the dispensing head 200. Further, the heat sink plate 220 may be configured to provide for precise temperature control of the nozzles 210a, 210b, 210c, 210d, 210e, 210f, 210g to prevent overheating of the nozzles 210a, 210b, 210c, 210d, 210e, 210f, 210g. It should be understood that the principles described herein with respect to the dispensing head 200 may be applied in various forms with various different numbers of components, dimensions, and shapes of components in the dispensing head, nozzles, spindles and the like.

Figure 8:
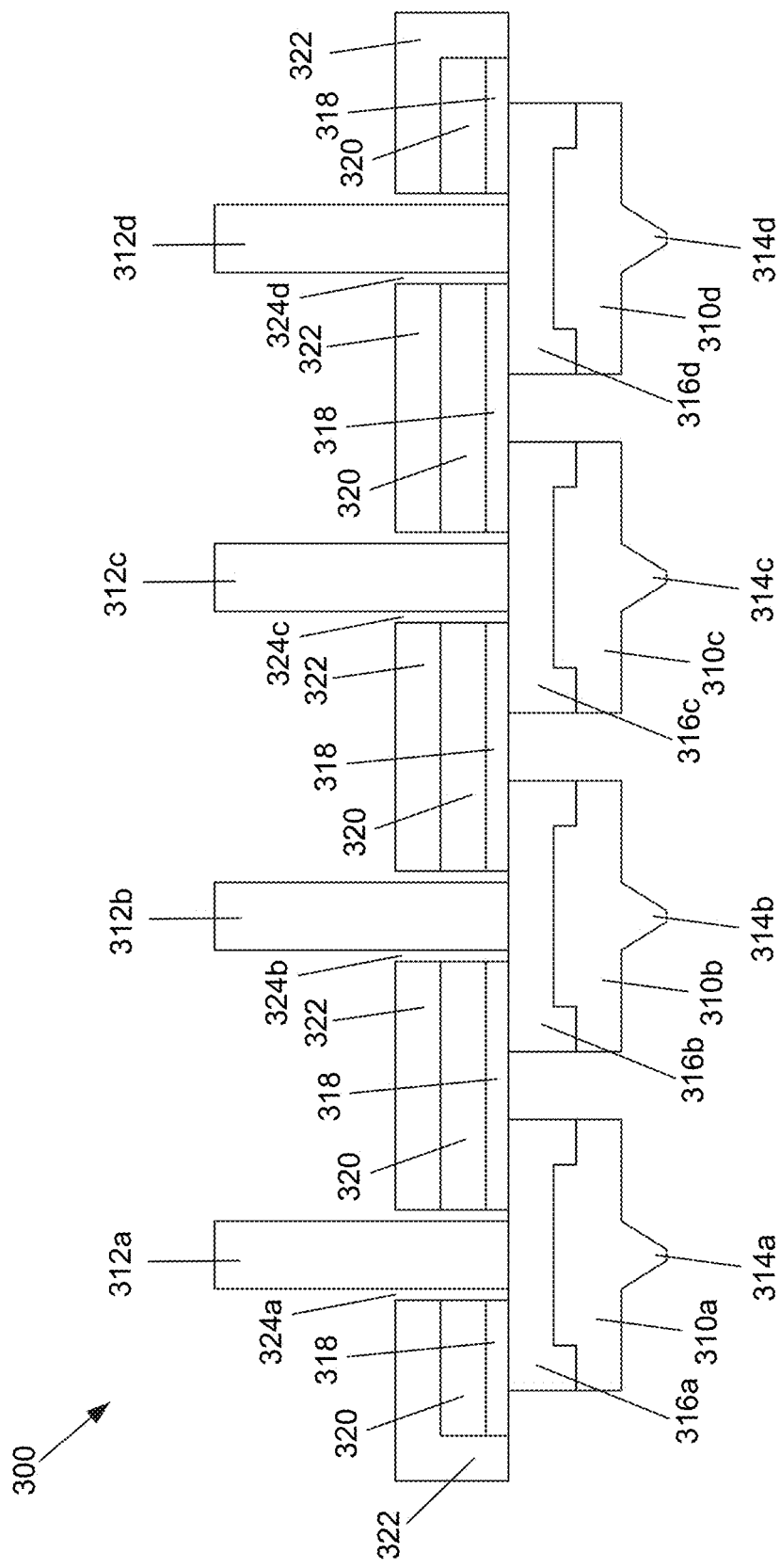
FIG. 8 depicts a side cutaway view of a four-spindle dispensing head in accordance with one embodiment.

FIG. 8 shows another embodiment of a four spindle dispensing head 300. The four spindle dispensing head 300 may include a first spindle 312a for moving a first nozzle 310a having a first nozzle tip 314a, a second spindle 312b for moving a second nozzle 310b having a second nozzle tip 314b, a third spindle 312c for moving a third nozzle 310c having a third nozzle tip 314c, and a fourth spindle 312d for moving a fourth nozzle 310d having a fourth nozzle tip 314d. The dispensing head 300 may include an adapter 322 that may include a first opening 324a for receiving the first spindle 312a, a second opening 324b for receiving the second spindle 312b, a third opening 324c for receiving the third spindle 312c, and a fourth opening 324d for receiving the fourth spindle 312d. The adapter 322 may include an insulative layer 320 and a heat sink plate 318 each having the openings 324a, 324b, 324c, 324d to receive the spindles 312a, 312b, 312c, 312d. The heat sink plate 318 may be attached to an energy source (not shown) and may be configured to remain stationary relative a main body (not shown) of the dispensing head 300 when the spindles 312a, 312b, 312c, 312d move relative to the main body of the dispensing head 300. The heat sink plate 318 may be located at the bottom of the adapter 322 to assure a uniform temperature profile over the different nozzles 310a, 310b, 310c, 310d. The heat sink plate 318 may include enough heat capacity to quickly reheat each of the nozzles 310a, 310b, 310c, 310d after the nozzles 310a, 310b, 310c, 310d have been used to heat an electronic component during placement. A back portion 316a, 316b, 316c, 316d of each respective nozzle 310a, 310b, 310c, 310d may be configured to contact the heat sink plate 318 when the spindles 312a, 312b, 312c, 312d are in an upward position. In other embodiments, no contact may occur.

The back portions 316a, 316b, 316c, 316d may each be nozzle adapters and may be made of a high thermally conductive material that may also have high specific heat capacity, such as copper. The nozzle 310a, 310b, 310c, 310d including the tips 314a, 314b, 314c, 314d may be made of a different material such as zirconium. In other embodiments, the nozzle 310a, 310b, 310c, 310d including the tips 314a, 314b, 314c, 314d may be made of copper. The mass of the nozzles 310a, 310b, 310c, 310d plus the adapter 322 may be dimensioned such that the draw of energy through the nozzle tips 314a, 314b, 314c, 314d and the electronic component (not shown) during a placement dwell cycle on a substrate leads to an acceptable temperature drop at the nozzle tips 314a, 314b, 314c, 314d. While not placing electronic components, the back portions 316a, 316b, 316c, 316d may be pulled to the heat sink plate 318 of the heating source and brought to the required temperature before the pick-up of the next electronic component. It should be understood that the principles described herein with respect to the dispensing head 300 may be applied in various forms with various different numbers of components, dimensions, and shapes of components in the dispensing head, nozzles, spindles and the like.

Figure 9:
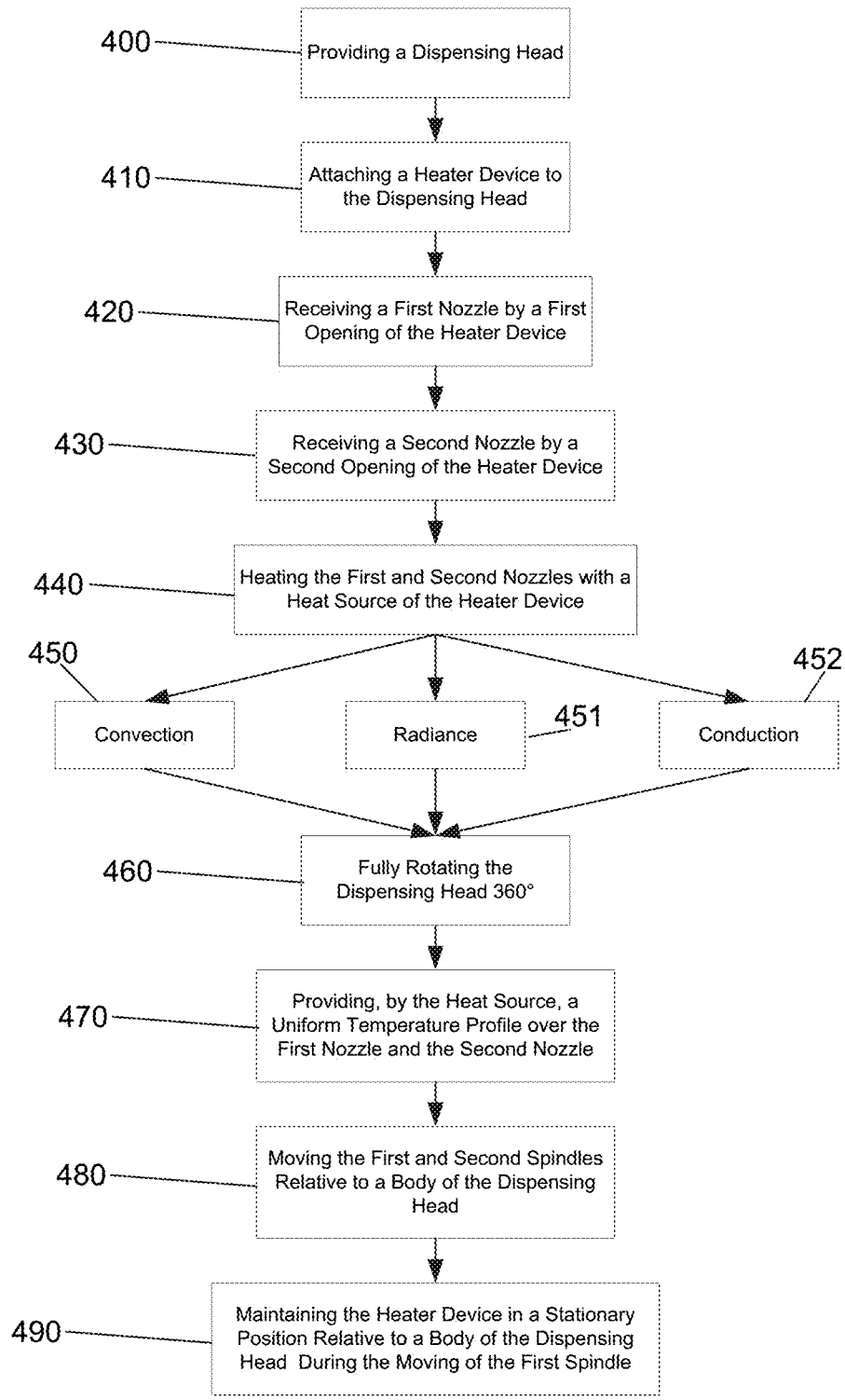
FIG. 9 depicts a method of heating a nozzle according to one embodiment.

Referring to FIG. 9, a method of heating a nozzle is contemplated. The method includes a first step 400 of providing a dispensing head, such as the dispensing head 100, 200, 300, the dispensing head including one or more spindles, such as the spindles 30a, 30b, 30c, 212a, 212b, 212c, 212d, 212e, 212f, 212g, 312a, 312b, 312c, 312d, the spindles configured for movement in a vertical direction, such as the direction Z as well as movement around the vertical direction in a rotary motion. The dispensing head may include a first nozzle, such as one of the nozzles 28a, 28b, 28c, 210a, 210b, 210c, 210d, 210e, 210f, 210g, 310a, 310b, 310c, 310d, attached to the spindle.

The method may include a second step 410 of attaching a heater device, such as the heater device 10, 201, 301, to the dispensing head, the heater device including a heat source, such as the heating elements 16a, 16b, 16c, 16d, 16e, 16f, the heater blocks 14a, 14b, 14c, and the heat sink plates 220, 318. The heater device further includes an opening, such as an opening 22a, 22b, 22c, 224a, 224b, 224c, 224d, 224e, 224f, 224g, 324a, 324b, 324c, 324d.

The method may include a third step 420 of receiving the first nozzle by the opening of the heater device. The method may include a fourth step 430 of receiving a second nozzle by a second opening of the heater device. The method may include a fifth step 440 of heating the first nozzle and the second nozzle with the heat source of the heater device above an ambient temperature. The heating of the fifth step 440 may be applied through one or all of convection 450, radiance 451, and/or conduction 452.

The method may include a sixth step 460 of fully rotating the dispensing head 360° while the heat source heats the nozzle(s). The method may include a seventh step 470 of providing, by the heat source, a uniform temperature profile over each of the nozzle(s). The method may include an eighth step 480 of moving the spindle(s) relative to a body, such as the body 110, of the dispensing head. The method may include a ninth step 490 of maintaining the heater device in a stationary position relative to the main body of the dispensing head during the moving of the spindle(s).

Additionally, the method may include moving the nozzle(s) proximate the heat source, and heating the nozzle(s) with the heat source when the nozzle(s) are not carrying an electronic component. The method may further include contacting the nozzle(s) with the heat source during the heating. The method may further include preventing or avoiding contact between the nozzle(s) and the heat source during heating.

Elements of the embodiments have been introduced with either the articles "a" or "an." The articles are intended to mean that there are one or more of the elements. The terms "including" and "having" and their derivatives are intended to be inclusive such that there may be additional elements other than the elements listed. The conjunction "or" when used with a list of at least two terms is intended to mean any term or combination of terms. The terms "first" and "second" are used to distinguish elements and are not used to denote a particular order.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

We claim:
1. A dispensing head comprising:
a first spindle configured for movement in a vertical direction;
a first nozzle operatively attached to the spindle; and
a heater device removably attachable to the dispensing head, the heater device including:

a heat source; and
an opening configured to receive the first nozzle, wherein the heat source is configured to heat the first nozzle above an ambient temperature,
wherein the heater device remains stationary relative to a main body of the dispensing head during picking and placing by the first spindle.

2. The dispensing head of claim 1, wherein the dispensing head includes a heater assembly surrounding the first nozzle configured to transfer heat to the first nozzle through at least one of convection, conduction, and radiance.

3. The dispensing head of claim 1, wherein the first spindle is adapted for full 360° rotation while the heat source heats the first nozzle.

4. The dispensing head of claim 1, further comprising a second spindle configured for movement in a vertical direction and a second nozzle operatively attached to the second spindle, wherein the heater device includes a second opening configured to receive the second nozzle, wherein the heat source is configured to heat the second nozzle by at least one of convection and radiance.

5. The dispensing head of claim 4, wherein the heat source is configured to provide a uniform temperature profile over the first nozzle and the second nozzle.

6. The dispensing head of claim 1, wherein the heat source includes a heating element and a heat sink.

7. The dispensing head of claim 1, wherein the heater device includes an insulated housing including a heated chamber.

8. The dispensing head of claim 1, wherein the first nozzle is configured to move proximate the heat source and become heated when the first nozzle is not picking or placing an electronic component.

9. The dispensing head of claim 1, wherein the first nozzle is configured to contact the heat source during heating.

10. An assembly system comprising:
a dispensing head including:
a spindle configured for movement in a vertical direction;
a nozzle operatively attached to the spindle; and
a heater device mountable to the dispensing head, the heater device including:
a heat source; and
an opening configured to receive the spindle, wherein the heat source is configured to heat the spindle by at least one of convection, conduction, and radiance; and
a positioning system configured to move the dispensing head;
wherein the dispensing head is configured to at least partially assemble an unfinished product, wherein the heater device remains stationary relative to a main body of the dispensing head during picking and placing by the first spindle.

11. A method of heating a nozzle comprising:
providing a dispensing head including:
a first spindle configured for movement in a vertical direction;
a first nozzle operatively attached to the spindle;
attaching a heater device to the dispensing head, the heater device including:
a heat source;
an opening; and
receiving the first spindle and the first nozzle by the opening; and
heating the first spindle and the first nozzle with the heat source above an ambient temperature;
moving the first spindle relative to a main body of the dispensing head; and
maintaining the heater device in a stationary position relative to the main body of the dispensing head during the moving of the first spindle.

12. The method of claim 11, wherein in the heater device further includes a heater assembly surrounding the first spindle and the first nozzle, the method further comprising transferring heat to the first spindle and the first nozzle through at least one of convection, conduction, and radiance.

13. The method of claim 11, further comprising fully rotating the first spindle 360° while the heat source heats the first spindle and the first nozzle.

14. The method of claim 11, wherein the dispensing head further includes a second spindle configured for movement in a vertical direction and a second nozzle operatively attached to the second spindle, wherein the heater device includes a second opening, the method further comprising:
receiving the second spindle and the second nozzle in the second opening; and
heating the second spindle and the second nozzle with the heat source above the ambient temperature.

15. The method of claim 14, further comprising providing, by the heat source, a uniform temperature profile over the first nozzle and the second nozzle.

16. The method of claim 11, wherein the heating occurs in an insulated housing that creates a heated chamber within the heater device.

17. The method of claim 11, further comprising moving the first nozzle proximate the heat source; and heating the first nozzle with the heat source when the first nozzle is not carrying an electronic component.

18. The method of claim 11, further comprising contacting the first nozzle with the heat source during heating.

* * * * *